United States Patent
Koyama

(10) Patent No.: US 7,683,612 B2
(45) Date of Patent: Mar. 23, 2010

(54) THIN FILM MAGNETIC SENSOR

(75) Inventor: Shigenobu Koyama, Tokai (JP)

(73) Assignee: Daido Steel Co., Ltd., Aichi-ken (JP)

( * ) Notice: Subject to any disclaimer, the term of this patent is extended or adjusted under 35 U.S.C. 154(b) by 0 days.

(21) Appl. No.: 12/345,756

(22) Filed: Dec. 30, 2008

(65) Prior Publication Data

US 2009/0212770 A1   Aug. 27, 2009

(30) Foreign Application Priority Data

Feb. 27, 2008 (JP) .............................. 2008-046925

(51) Int. Cl.
*G01R 33/02* (2006.01)
*G01R 33/09* (2006.01)

(52) U.S. Cl. ...................................... 324/249; 324/252
(58) Field of Classification Search ............. 324/207.21, 324/249, 252; 365/8, 158; 360/326

See application file for complete search history.

(56) References Cited

U.S. PATENT DOCUMENTS 7,170,287 B2 * 1/2007 Kobayashi et al. .......... 324/252

FOREIGN PATENT DOCUMENTS

| JP | 11-87804 | 3/1999 |
| JP | 11-274599 | 10/1999 |

OTHER PUBLICATIONS

English language Abstract of JP 11-87804, Mar. 30, 1999.
English language Abstract of JP 11-274599, Oct. 8, 1999.

* cited by examiner

*Primary Examiner*—Bot L LeDynh
(74) *Attorney, Agent, or Firm*—Greenblum & Bernstein, P.L.C.

(57) ABSTRACT

The thin film magnetic sensor comprising a GMR film having a Giant Magneto-Resistance effect; and thin film yokes formed of a soft magnetic material connected electrically to both ends of the GMR film;

wherein the thin film yoke has a high sensitivity portion with a demagnetizing factor of $N_L$ in a magnetic sensitive direction, and a low sensitivity portion with a demagnetizing factor of $N_H(>N_L)$ in the magnetic sensitive direction, the low sensitivity portion being connected electrically in series with the high sensitivity portion.

20 Claims, 6 Drawing Sheets

THIN FILM MAGNETIC SENSOR

BACKGROUND OF THE INVENTION

Field of the Invention

The present invention relates to a thin film magnetic sensor. More specifically, the present invention relates to a thin film magnetic sensor suitable for detection of rotational information, for example, of car axles, rotary encoders, and industrial gears; detection of positional and speed information, for example, of stroke positions of hydraulic cylinders/pneumatic cylinders, and slides of machine tools; detection of current information, for example, of arc current of industrial welding robots; and geometric direction compass.

A magnetic sensor is an electronic device for converting a detected amount of electromagnetic force such as current, voltage, electric power, magnetic field or magnetic flux, a detected amount of dynamic quantity such as position, speed, acceleration, displacement, distance, tension, pressure, torque, temperature or humidity, and a detected amount of biochemical quantity, into a voltage by way of a magnetic field. A magnetic sensor is classified into a hall sensor, an Anisotropic Magneto-Resistance (AMR) sensor, a Giant Magneto-Resistance (GMR) sensor and the like, depending on the detection method for the magnetic field.

Among the magnetic sensors described above, the GMR sensor is advantageous in that:

(1) The GMR sensor has an extremely large maximum value for the change coefficient of a specific electric resistivity, i.e., MR ratio (MR ratio=$\Delta\rho/\rho_0$ ($\Delta\rho=\rho_H-\rho_0$ where $\rho_H$ is a specific electric resistivity under an external magnetic field H, and $\rho_0$ is a specific electric resistivity under an external magnetic field of zero) compared with the AMR sensor;

(2) The GMR sensor has less temperature change of resistance value compared with the hall sensor; and (3) The GMR sensor is suitable for microminiaturization since the material having a Giant Magneto-Resistance effect is a thin film material. Accordingly, it is expected that the GMR sensor is applied to a high sensitivity micromagnetic sensor which is used in computers, electric power equipment, automobiles, home domestic equipment, portable equipment, etc.

The materials that are known to show the GMR effect are as the following: an artificial lattice formed of a multilayered film which has a ferromagnetic layer such as permalloy etc., and has a non-magnetic layer such as Cu, Ag, Au, etc., or formed of a multilayered film of a 4-layered structure (so-called "spin valve") which has an antiferromagnetic layer, a ferromagnetic layer (a fixed layer), a non-magnetic layer and a ferromagnetic layer (a free layer); a metal-metal based nano-granular material which has a nanometer-sized fine particle formed of a ferromagnetic metal such as permalloy etc., and has a grain boundary phase formed of a non-magnetic metal such as Cu, Ag, Au, etc.; a tunnel junction film causing MR (Magneto-Resistance) effect by the spin dependent tunnel effect; and a metal-insulator based nano-granular material which has a nanometer-sized fine particle formed of a ferromagnetic metal alloy, and has a grain boundary phase formed of a non-magnetic and insulating material.

Among them, the multilayered film typically represented by the spin valve generally has a feature of high sensitivity in a low magnetic field. For preparing the multilayered film, however, it is necessary to laminate the thin films formed of various materials at a high accuracy, with the result that stability and yield are poor and there is a limit for restricting the manufacturing cost. Accordingly, the multilayered films of this kind are exclusively used only for high-value added devices such as a magnetic head for a hard disk, and are considered as difficult to apply to a magnetic sensor which is forced to make competition in price with an AMR sensor or a hall sensor having a low unit price. Further, since diffusion tends to be caused between multilayered films and the GMR effect tends to be lost, the multilayered films have a significant drawback of poor heat resistance.

On the other hand, the nano-granular materials are generally manufactured with ease and have good reproducibility. Accordingly, when the nano-granular materials are applied to magnetic sensors, they can decrease the cost of the magnetic sensors. Particularly, there are advantages as the following:

(1) The metal-insulator based nano-granular materials show a high MR ratio exceeding 10% at a room temperature when the composition is optimized;

(2) The metal-insulator based nano-granular materials are capable of attaining microminiaturization and low power consumption of the magnetic sensor simultaneously since the specific electric resistivity $\rho$ is outstandingly high; and (3) The metal-insulator based nano-granular materials are usable even under a high temperature circumstance different from the spin valve film containing an antiferromagnetic film of poor heat resistance. The metal-insulator based nano-granular materials, however, involve a problem that the magnetic field sensitivity is extremely small in a low magnetic field.

For overcoming the problem, Japanese Unexamined Patent Publication No. H11(1999)-087804 describes that soft magnetic thin films are disposed on both ends of a Giant Magneto-Resistance thin film thereby improving the magnetic field sensitivity of the Giant Magneto-Resistance thin film. Further, this patent document also describes that a method of manufacturing a thin film magnetic sensor of forming a permalloy thin film (a soft magnetic film) of 2 µm thickness on a substrate, forming a gap of about 9 µm width to the permalloy thin film by using an ion beam etching apparatus, and laminating a nano-granular GMR film having a $Co_{38.6}Y_{41.0}O_{47.4}$ composition to the gap.

Further, Japanese Unexamined Patent Publication No. H11 (1999)-274599 describes that a thickness of a Giant Magneto-Resistance thin film is made to be less than or equal to that of a soft magnetic thin film in order to further improve a magnetic field sensitivity in the thin film magnetoresistive device where the soft magnetic thin films are disposed on both ends of the Giant Magneto-Resistance thin film.

[Patent document 1] Japanese Unexamined Patent Publication No. H11(1999)-087804

[Patent document 2] Japanese Unexamined Patent Publication No. H11(1999)-274599

A soft magnetic material having a large saturation magnetization and a high magnetic permeability has extremely high magnetic field sensitivity, and it shows extremely large magnetization in a relatively weak external magnetic field. Accordingly, when thin film yokes formed of a soft magnetic material are brought closer to both ends of a GMR film, the external magnetic field is amplified by the thin film yoke, and an intense magnetic field from 100 to 10000 times as high as the external magnetic field exerts on the GMR film. As a result, the magnetic field sensitivity of the GMR film can be increased remarkably.

Further, the intensity of the magnetic field generated in the GMR film depends also on the shape of the thin film yoke.

The more elongate the shape of the thin film yoke, the stronger is a magnetic field generated in the GMR film. This is because the demagnetizing field in the magnetic sensitive direction is decreased by making the shape of the thin film yoke elongate. "Magnetic sensitive direction" means a direction of applying the external magnetic field when the magnetic field sensitivity of the GMR film is maximized.

The magnetic sensor is generally formed as a bridge or a half-bridge where detection devices are arranged orthogonally. Further, such magnetic sensor is usually selected that is capable of obtaining linear output characteristics within a range of using magnetic fields. Since the maximum output of the magnetic sensor using the GMR film is determined depending on the physical property of the material for the GMR film, the magnetic field detecting sensitivity is determined by the shape magnetic anisotropy (demagnetizing field) of the thin film yoke. Accordingly, in the case of use in a wide magnetic field range, the magnetic field resolution is worsened by so much. On the contrary, since a sensor of good magnetic field resolution is saturated by a low magnetic field, it can be used only within a range of minute magnetic field.

For example, in the case of measuring magnetic characteristics of a magnetic material, it is desired to roughly measure the region of a strong magnetic field where the magnetization is saturated and, it is desired to accurately measure the vicinity of a coercive force where the magnetization changes abruptly. For the measurement of the magnetic field in such a case, it is necessary to use two kinds of magnetic sensors, that is, for use in a high magnetic field and a low magnetic field in combination. However, the use of the two types of sensors is not preferred. Because it requires twice or more times installation space, and this makes the measurement of a magnetic field difficult in a minute region. It is not preferred also in view of the cost.

SUMMARY OF THE INVENTION

The problem to be solved by the present invention is to provide a thin film magnetic sensor using a GMR film capable of measuring both high magnetic field and low magnetic field simultaneously at an appropriate resolution.

One aspect of the present invention for overcoming the above problem, there is provided a thin film magnetic sensor comprising:

a GMR film having a Giant Magneto-Resistance effect; and thin film yokes formed of a soft magnetic material connected electrically to both ends of the GMR film;

wherein the thin film yokes have a high sensitivity portion with a demagnetizing factor of $N_L$ in a magnetic sensitive direction, and a low sensitivity portion with a demagnetizing factor of $N_H(>N_L)$ in the magnetic sensitive direction, the low sensitivity portion being connected electrically in series with the high sensitivity portion.

In the case of disposing the high sensitivity portion and the low sensitivity portion to the thin film yokes and connecting them electrically in series, when a low magnetic field exerts, magnetic flux flows only into the high sensitivity portion. Further, since the demagnetizing factor $N_L$ is relatively small in the high sensitivity portion, magnetization is saturated with a small magnetic field H. As a result, the magnetic characteristics in the region of a low magnetic field can be measured at a high accuracy.

On the other hand, when a high magnetic field exerts, then magnetic flux flows also to the low sensitivity portion. In addition, since the demagnetizing factor $N_H$ is relatively large in the low sensitivity region, the gradient of the magnetoresistivity MR relative to the magnetic field H is decreased, and a larger magnetic field H is necessary for saturating magnetization. As a result, the region of a high magnetic field can be measured over a wide range.

PREFERRED EMBODIMENTS OF THE INVENTION

Figure 1A:
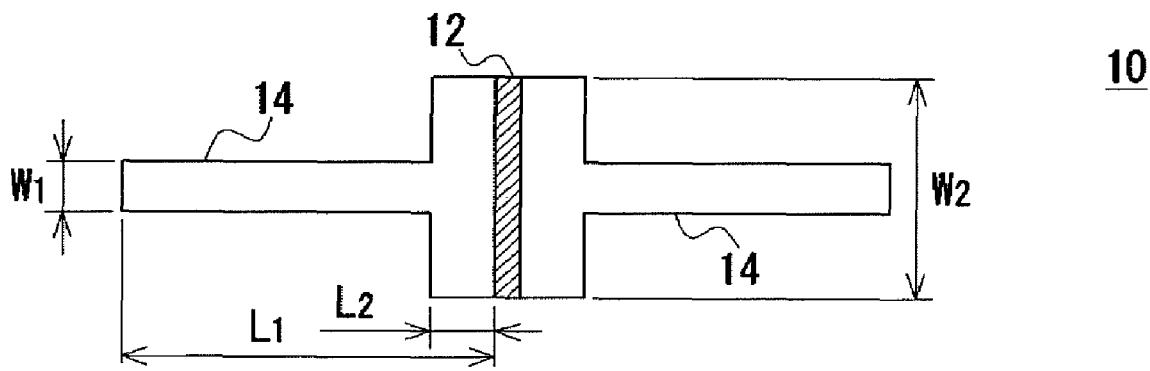
FIG. 1A is a plane view of a thin film magnetic sensor according to a first embodiment of the present invention.

The present invention is to be described by way of an embodiment specifically.

(1. Thin Film Magnetic Sensor)

The thin film magnetic sensor according to the present invention has a GMR film having a Giant Magneto-Resistance effect, and has thin film yokes formed of a soft magnetic material connected electrically to both ends of the GMR film.

(1.1 GMR Film)

The GMR film is used for sensing the change of an external magnetic field as a change of an electric resistance R and, as a result, detecting the same as a change of voltage and it is formed of a material having a Giant Magneto-Resistance (GMR) effect. For detecting the change of the external magnetic field at a high sensitivity, it is preferred that the absolute value of the MR ratio of the GMR film is larger. Specifically, the absolute value for the MR ratio of the GMR film is preferably 5% or more and, more preferably, 10% or more.

Further, since the GMR film is electrically connected directly with the thin film yoke, a GMR film having a specific electric resistivity ρ higher than that of the thin film yoke is used. Generally, when the specific electric resistivity ρ of the GMR film is excessively low, it is not preferred since electric short circuit is caused between thin film yokes. On the other hand, when the specific electric resistivity ρ of the GMR film is excessively high, noises are increased and it is difficult to detect the change of the external magnetic field as the change of voltage. Specifically, the specific electric resistivity ρ of the GMR film is preferably $10^3$ μΩcm or more and $10^{12}$ μΩcm or less and, more preferably, $10^4$ μΩ cm or more and $10^{11}$ μΩ cm or less.

While there are various materials for satisfying the conditions described above, the metal-insulator based nano-granular material described above is particularly suitable among them. The metal-insulator based nano-granular material not only has a high MR ratio and a high specific electric resistivity ρ but also the MR ratio does not fluctuate greatly by slight compositional fluctuation. Therefore, there is such advantage that a thin film having stable magnetic characteristics can be manufactured at good reproducibility and at a low cost.

The metal-insulator based nano-granular material used for the GMR film is as the following:

(1) Oxide type nano-granular alloy such as Co—$Y_2O_3$ type nano-granular alloy, Co—$Al_2O_3$ type nano-granular alloy, Co—$Sm_2O_3$ type nano-granular alloy, Co—$Dy_2O_3$ type nano-granular alloy, and FeCo—$Y_2O_3$ type nano-granular alloy; and (2) Fluoride type nano-granular alloy such as Fe—$MgF_2$, FeCo—$MgF_2$, Fe—$CaF_2$, and FeCo—$AlF_3$.

The shape and the size of the GMR film are not particularly restricted and they are determined such that the aimed magnetic field sensitivity is obtained. Generally, the resistance value is in proportion with the length and in inverse proportion with the sectional area thereof. Accordingly, the electric resistance R of the GMR film can be increased as the thickness is decreased, as the length is shortened, or as the lateral width is narrowed. By increasing the electric resistance R, power consumption of device can be lowered. When the electric resistance R of the GMR film is excessively high, however, impedance mismatching may sometimes occur with respect to an amplifier.

(1.2 Thin Film Yoke)

Thin film yokes are opposed by way of a gap and a GMR film is electrically connected with the thin film yokes in the gap or at the vicinity of the gap.

"The vicinity of the gap" means herein a region that undergoes the effect of a large-amplified magnetic field generated at the top end of the thin film yokes. Since the magnetic field generated between the thin film yokes is largest in the gap, it is most preferred to dispose the GMR film in the gap. However, when the magnetic field exerting on the GMR film is sufficiently large in view of practical use, the GMR film may also be entirely or partially out of the gap (for example, on the side of the upper surface of the thin film yoke or on the side of the lower surface thereof).

The thin film yoke is used for improving the magnetic field sensitivity of the GMR film and is formed of a soft magnetic material. For obtaining high magnetic field sensitivity to the weak magnetic field, it is preferred to use a material having a high magnetic permeability µ and/or a high saturation magnetization Ms for the thin film yoke. Specifically, the magnetic permeability µ is, preferably, 100 or more and, more preferably, 1000 or more. Further, the saturation magnetization Ms is preferably 5 (k Gauss) or more and, more preferably, 10 (k Gauss) or more.

As the material for the thin film yoke, permalloy (40 to 90% Ni—Fe alloy), sendust ($Fe_{74}Si_9Al_{17}$) ("sendust" is a trademark), HARDPERM ($Fe_{12}Ni_{82}Nb_6$) ("HARDPERM" is a trademark), $Co_{88}Nb_6Zr_6$ amorphous alloy, $(Co_{94}Fe_6)_{70}Si_{15}B_{15}$ amorphous alloy, FINEMET ($Fe_{75.6}Si_{13.2}B_{8.5}Nb_{1.9}Cu_{0.8}$) ("FINEMET" is a trademark), nano max ($Fe_{83}HF_6C_{11}$) ("nano max" is a trademark), $Fe_{85}Zr_{10}B_5$ alloy, $Fe_{93}Si_3N_4$ alloy, $Fe_{71}B_{11}N_{18}$ alloy, $Fe_{71.3}Nd_{9.6}O_{19.1}$ nano-granular alloy, $Co_{70}Al_{10}O_{20}$ nano-granular alloy, $Co_{65}Fe_5Al_{10}O_{20}$ alloy, etc., are suitable.

The thin film yoke has an effect of amplifying the external magnetic field and increasing the magnetic field sensitivity of the GMR film. The amplifying effect can be improved not only by the material but also by optimizing the shape of the thin film yoke.

Further, when the shape of the thin film yoke is optimized and the high sensitivity portion and the low sensitivity portion are disposed to the thin film yoke, a magnetic sensor capable of measuring the region of a low magnetic field accurately and the region of a high magnetic field roughly but over a wide range can be obtained.

"High sensitivity portion" means herein a region where the demagnetizing factor $N_L$ in the magnetic sensitive direction is smaller than that of the low sensitivity portion. Generally, the demagnetizing factor can be decreased as the length in the direction parallel to the magnetic sensitive direction is longer compared with the length in the direction perpendicular to the magnetic sensitive direction. Accordingly, for forming the high sensitivity portion, it may suffice that a longitudinally elongate portion which extends in the magnetic sensitive direction is present in any portion of the thin film yoke. The longitudinally elongate portion may be disposed by the number of one or more. By optimizing the shape, the number, etc., of the longitudinally elongate portion, the sensitivity in the region of a low magnetic field can be controlled.

"Low sensitivity portion" means a region where the demagnetizing factor $N_H$ in the magnetic sensitive direction is larger than that of the high sensitivity portion ($N_H > N_L$). It may suffice that the low sensitivity portion is connected electrically in series with the high sensitivity portion. When a laterally elongate portion extended in the direction intersecting the magnetic sensitive direction is formed to any portion of the longitudinally elongate portion which constitutes the high sensitivity portion, the laterally elongate portion functions as the low sensitivity portion. The laterally elongate portion is preferably formed in the direction perpendicular to the magnetic sensitive direction. The laterally elongate portion may be disposed by the number of one or more. By optimizing the shape, the number, etc., of the laterally elongate portion, the sensitivity in the region of a high magnetic field can be controlled.

(2. Specific Example)

(2.1 Specific Example (1))

FIG. 1A shows a first specific example of a thin film magnetic sensor according to the present invention. In FIG. 1A, a thin film magnetic sensor 10 has a GMR film 12 having a Giant Magneto-Resistance effect, and has thin film yokes 14,14 formed of a soft magnetic material connected electrically to both ends of the GMR film 12. The thin film yokes 14,14 each has a T-shape and is electrically connected by way of the lateral bar portion of the T-shape with the GMR film 12. The entire length $L_1$ for each of the thin film yokes 14,14, the width $W_1$ for the longitudinal bar portion, the length $L_2$ for the lateral bar portion, and the width $W_2$ for the lateral bar portion can be optionally selected in accordance with the purpose. By optimizing the sizes of them, the sensitivity in the region of a low magnetic field and the sensitivity in the region of a high magnetic field can be controlled.

Figure 1B:
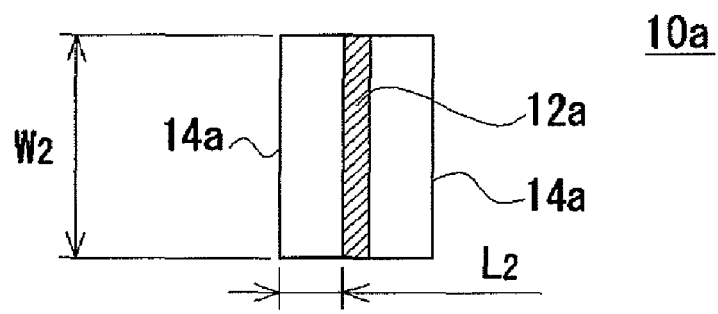
FIG. 1B is a plane view of a low sensitivity sensor.
Figure 1C:
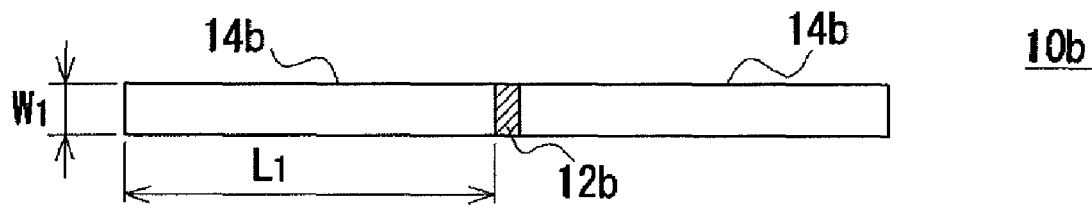
FIG. 1C is a plane view of a high sensitivity sensor.

It can be considered that the thin film magnetic sensor 10 shown in FIG. 1A has the low sensitivity sensor 10a shown in FIG. 1B and the high sensitivity sensor 10b shown in FIG. 1C, the low sensitivity sensor 10a and the high sensitivity sensor 10b being electrically connected in series to each other.

That is, in the high sensitivity sensor 10b, since each of the thin film yokes 14b,14b connected electrically to both ends of the GMR film 12b has a relatively longer length $L_1$ to the width $W_1$, it has a relatively small demagnetizing factor $N_L$. Accordingly, each of the thin film yokes 14b,14b has a large amplifying effect to the external magnetic field and magnetization is saturated by a smaller external magnetic field.

On the other hand, in the low sensitivity sensor 10a, since each of the thin film yokes 14a,14a connected electrically to both ends of the GMR film 12a has a relatively shorter length $L_2$ to the width $W_2$, it has a relatively large demagnetizing factor $N_H$. Accordingly, each of the thin film yokes 14a,14a has a smaller amplifying effect to the external magnetic field, and a larger external magnetic field is necessary for saturating magnetization.

When a low magnetic field exerts on the thin film magnetic sensor 10 where the low sensitivity sensor 10a and the high sensitivity sensor 10b are connected electrically in series with each other, an external magnetic field amplified only by the longitudinal bar portion (longitudinally elongate portion) of the thin film yokes 14,14 exerts exclusively on the GMR film 12. That is, in the thin film magnetic sensor 10, only the high sensitivity sensor 10b functions as the sensor. Accordingly, the region of a low magnetic field can be measured at a high accuracy.

On the other hand, when a high magnetic field exerts on the thin film magnetic sensor 10, an external magnetic field amplified not only by the longitudinal bar portion but also by the lateral bar portion (laterally elongate portion) of the thin film yokes 14,14 exerts on the GMR film 12. That is, in the thin film sensor 10, not only the high sensitivity sensor 10b but also the low sensitivity sensor 10a functions as the sensor. Accordingly, the region of a high magnetic field can be measured over a wide range.

In the thin film magnetic sensor 10 shown in FIG. 1A, while each of the thin films yokes 14,14 has a T-shape, a substantially identical effect can be obtained also by an L-shape where the longitudinal bar portion is localized to either side. Further, when the longitudinal bar portion is disposed by the number of two or more, a thin film magnetic sensor having sensitivity in accordance with the size of the longitudinal bar portion can be obtained.

Further, while the thin film magnetic sensor 10 shown in FIG. 1A can be used alone, plural thin film magnetic sensors 10 may be connected electrically and used.

For example, two thin film magnetic sensors 10 may be connected in series and may be disposed such that the magnetic sensitive axes of the two thin film sensors 10 intersect to each other (half-bridge). With such a constitution, the external magnetic field can be detected with no effect by the fluctuation of a reference potential due to temperature by measuring the neutral point potential.

Further, a bridge circuit may be constituted by using, for example, thin film magnetic sensors 10 by the number of four (full-bridge). When the bridge circuit is constituted, by taking a difference for the neutral point potential, the output can be doubled compared with a case of using two thin film magnetic sensors 10.

(2.2 Specific Example (2))

Figure 2:
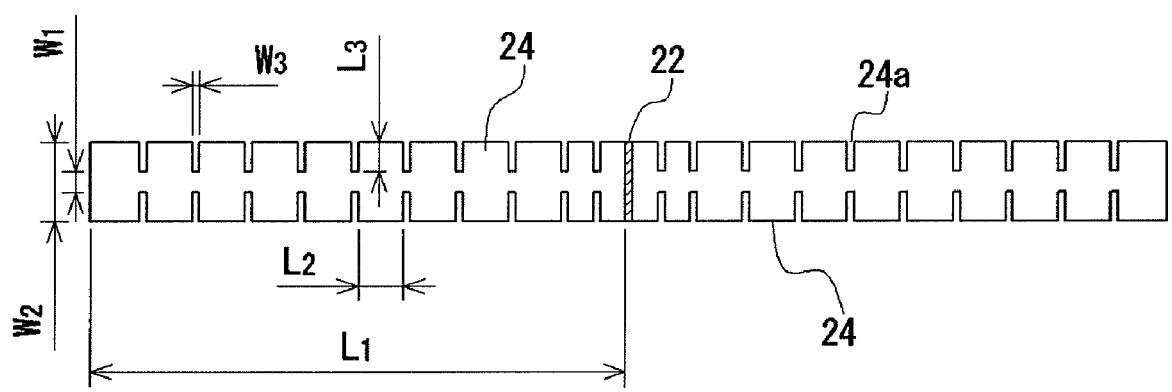
FIG. 2 is a plan view of a thin film magnetic sensor according to a second embodiment of the present invention.

FIG. 2 shows a second specific example of a thin film magnetic sensor according to the present invention. In FIG. 2, a thin film magnetic sensor 20 has a GMR film 22 having a Giant Magneto-Resistance effect, and has thin film yokes 24,24 formed of a soft magnetic material connected electrically to both ends of the GRM film 22. Each of the thin film yokes 24,24 has a rectangular shape having a width identical with that of the GMR film 22, and plural notches 24a,24a . . . are formed in the direction intersecting the magnetic sensitive direction.

"Notch" means a portion formed by cutting off a portion of the thin film yoke such that the thin film yoke is divided into a high sensitivity region and a low sensitivity region.

The notch includes, for example, (1) A notch (slit) formed by cutting off a thin film yoke at a predetermined width;

(2) A notch formed by cutting off a thin film yoke in a wedge shape;

(3) A notch for making a step in a thin film yoke; and (4) A notch for cutting off a thin film yoke in a concave shape.

The notch described above may be disposed by the number of one or two or more. In the case of providing plural notches 24a,24a . . . , the distance and the width of them may be identical with each other or different from each other. Further, while it may suffice that the notches 24a,24a . . . are disposed so as to intersect the magnetic sensitive direction, they are preferably disposed in the direction perpendicular to the magnetic sensitive direction.

In the embodiment shown in FIG. 2, plural notches 24a, 24a each having a predetermined width in the direction perpendicular to the magnetic sensitive direction are disposed on the right and left of the thin film yokes 24,24.

The thin film yokes 24,24 correspond to those in which plural laterally elongate portions are further joined to the longitudinal bar portion (longitudinally elongate portion) of the T-shape thin film yokes 14,14 of the thin film magnetic sensor 10 shown in FIG. 1A.

That is, in the central portion (longitudinally elongate portion) of the thin film yokes 24,24, a soft magnetic material is in continuous along the magnetic sensitive direction and in a state connected magnetically. Since the central portion of the thin film yokes 24,24 has a length $L_1$ longer than the width $W_1$, it has a relatively small demagnetizing factor $N_L$. Accordingly, the central portion of the thin film yokes 24,24 has a large amplifying effect to the external magnetic field and magnetization is saturated by a smaller external magnetic field.

On the other hand, on both ends of the thin film yokes 24,24, the soft magnetic material is not continuous along the magnetic sensitive direction but intervened by the notches 24a,24a . . . . Since the laterally elongate portion extended right and left from the central portion has a length $L_2$ shorter than the width $W_2$ and, in addition, a portion between the laterally elongate portions is intervened by the notches 24a, 24a . . . each having length $L_3$×width $W_3$, both ends of the thin film yokes 24,24 have a relatively large demagnetizing factor $N_H$. Accordingly, both ends of the thin film yokes 24,24 have small amplifying effect to the external magnetic field, and a larger external magnetic field is necessary for saturating magnetization.

When a low magnetic field exerts on such a thin film magnetic sensor 20, an external magnetic field amplified exclusively only by the central portion (longitudinally elongate portion) of the thin film yokes 24,24 exerts on the GMR film 22. Accordingly, the region of a low magnetic field can be measured at a high accuracy.

On the other hand, when a high magnetic field exerts on the thin film magnetic sensor 20, magnetic flux flows also into the laterally elongate portion extended to both ends. The magnetic flux flowing therein are leaked to the notches 24a,24a . . . and a portion of the leaked magnetic flux flows into the adjacent laterally elongate portion. Accordingly, when a high magnetic field exerts on the thin film magnetic sensor 20, an external magnetic field amplified not only by the central portion of the thin film yokes 24,24 but also by the laterally elongate portion intervened by the notches 24a,24a . . . on both ends exerts on the GMR film 22. Accordingly, the region of a high magnetic field can be measured over a wide range.

In the thin film magnetic sensor 20 shown in FIG. 2, while the thin film yokes 24,24 have one longitudinally elongate portion in the central portion, the longitudinally elongate portions may be disposed by the number of two or more (for example, in the case of providing them on both ends or providing them on both ends and at the central portion). In this case, when the size for the longitudinally elongate portion is optimized, a thin film magnetic sensor having sensitivity in accordance with the size can be obtained.

The thin film magnetic sensor 20 shown in FIG. 2 may be used alone or may also constitute a half-bridge or a full-bridge.

(2.3 Specific Example (3))

Figure 3:
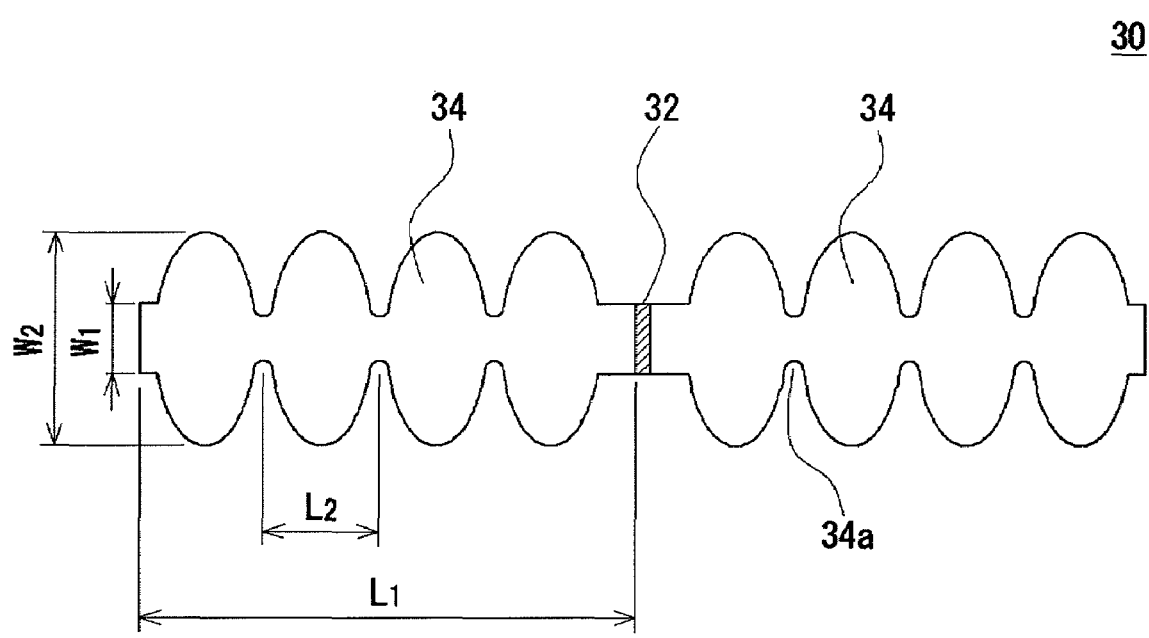
FIG. 3 is a plan view of a thin film magnetic sensor according to a third embodiment of the present invention.

FIG. 3 shows a third specific example of a thin film magnetic sensor according to the present invention. In FIG. 3, a thin film magnetic sensor 30 has a GMR film 32 having a Giant Magneto-Resistance effect, and has thin film yokes 34,34 formed of a soft magnetic material connected electrically to both ends of the GMR film 32. Each of the thin film yokes 34,34 has a rectangular shape having a width wider than that of the GMR film 32 in which plural notches 34a,34a . . . are formed in the direction intersecting the magnetic sensitive direction.

In the example showing in FIG. 3, the lateral width of the central portion (longitudinally elongate portion) of the thin film yokes 34,34 is substantially equal with the lateral width of the GMR film 32. Further, each of the notches 34a,34a . . . has a wedge shape and the top end of the wedge has an arcuate shape. Further, the top end of the laterally elongate portion extended in the direction perpendicular to the magnetic sensitive direction also has an arcuate shape.

Other constitutions of the thin film yokes 34,34 . . . are identical with those of the thin film magnetic sensor 20 shown in FIG. 2.

In the central portion (longitudinally elongate portion) of the thin film yokes 34,34, a soft magnetic material is in continuous along the magnetic sensitive direction and in a state connected magnetically. Since the central portion of the thin film yokes 34,34 has a length $L_1$ longer than the width $W_1$, it has a relatively small demagnetizing factor $N_L$. Accordingly, the central portion of the thin film yokes 34,34 has a large amplifying effect to the external magnetic field and magnetization is saturated by a smaller external magnetic field.

On the other hand, on both ends of the thin film yokes 34,34, the soft magnetic material is not continuous along the magnetic sensitive direction but intervened by the notches 34a,34a . . . . Since the laterally elongate portion extended right and left from the central portion has a length $L_2$ shorter than the width $W_2$ and, in addition, a portion between the laterally elongate portions is intervened by the wedge shaped notches 34a,34a . . . , both ends of the thin film yokes 34,34 have a relatively large demagnetizing factor $N_H$. Accordingly, both ends of the thin film yokes 34,34 have small amplifying effect to the external magnetic field, and a larger external magnetic field is necessary for saturating magnetization.

When a low magnetic field exerts on such a thin film magnetic sensor 30, an external magnetic field amplified exclusively only by the central portion (longitudinally elongate portion) of the thin film yokes 34,34 exerts on the GMR film 32. Accordingly, the region of a low magnetic field can be measured at a high accuracy.

On the other hand, when a high magnetic field exerts on the thin film magnetic sensor 30, magnetic flux flows also into the laterally elongate portion extended to both ends. The magnetic flux flowing therein are leaked to the notches 34a,34a . . . and a portion of the leaked magnetic flux flows into the adjacent laterally elongate portion. Accordingly, when a high magnetic field exerts on the thin film magnetic sensor 30, an external magnetic field amplified not only by the central portion of the thin film yokes 34,34 but also by the laterally elongate portion intervened by the notches 34a,34a . . . on both ends exerts on the GMR film 32. Accordingly, the region of a high magnetic field can be measured over a wide range.

In the thin film magnetic sensor 30 shown in FIG. 3, while the longitudinally elongate portion is present by the number of one in the central portion of the thin film yokes 34,34, the longitudinally elongate portions may be disposed by the number of two or more. In this case, when the size for the longitudinally elongate portion is optimized, a thin film magnetic sensor having sensitivity in accordance with the size can be obtained.

Further, the thin film magnetic sensor 30 shown in FIG. 3 may be used alone, or it may also constitute a half-bridge or a full-bridge.

(3. Manufacturing Method of Thin Film Magnetic Sensor)

A thin magnetic sensor according to the present invention can be obtained by laminating each of thin films at a predetermined order using photolithography technique.

In this case, as a method of forming each of the thin films, known methods such as various kinds of PVD, for example, sputtering, vacuum vapor deposition, etc., plating, CVD, etc., can be used.

Further, a thin film having a predetermined shape can be manufactured by:

(1) A method of forming a thin film having a predetermined composition over the entire surface of a substrate, and removing an unnecessary portion of the thin film in accordance with a predetermined shape pattern by etching (for example, Ar ion beam etching, wet etching by chemicals, reactive etching, etc.), or (2) A method of forming a mask having a predetermined shape pattern on the substrate surface by using a photoresist or the like, forming a thin film having a predetermined composition over the entire surface of the mask, and then removing the mask.

(4. Operation of Thin Film Magnetic Sensor)

In the case of providing a high sensitivity portion and a low sensitivity portion to thin film yokes, and connecting both of them electrically in series, when a low magnetic field exerts, magnetic flux flows only into the high sensitivity portion. In addition, in the high sensitivity portion, since the demagnetizing factor $N_L$ is relatively smaller, magnetization is saturated by a low magnetic field H. As a result, magnetic characteristics in the region of a low magnetic field can be measured at a high accuracy.

On the other hand, when a high magnetic field exerts, magnetic flux flows also into the low sensitivity portion. In addition, since the demagnetizing factor $N_H$ is relatively larger in the low sensitivity portion, the gradient of the magnetic resistance MR to the magnetic field H is decreased, and a higher magnetic field H is necessary for saturating magnetization. As a result, the region of a high magnetic field can be measured over a wide range.

EXAMPLE 1

A thin film magnetic sensor 10 shown in FIG. 1 was manufactured and MR characteristics were evaluated. An FeCo—MgF$_2$ nano-granular alloy was used for the GMR film 12 and a $(Co_{94}Fe_6)_{70}Si_{15}B_{15}$ amorphous alloy was used for the thin film yokes 14,14.

Further, the size for each of the portions of the thin film yokes 14,14 is as described below.

Figure 4:
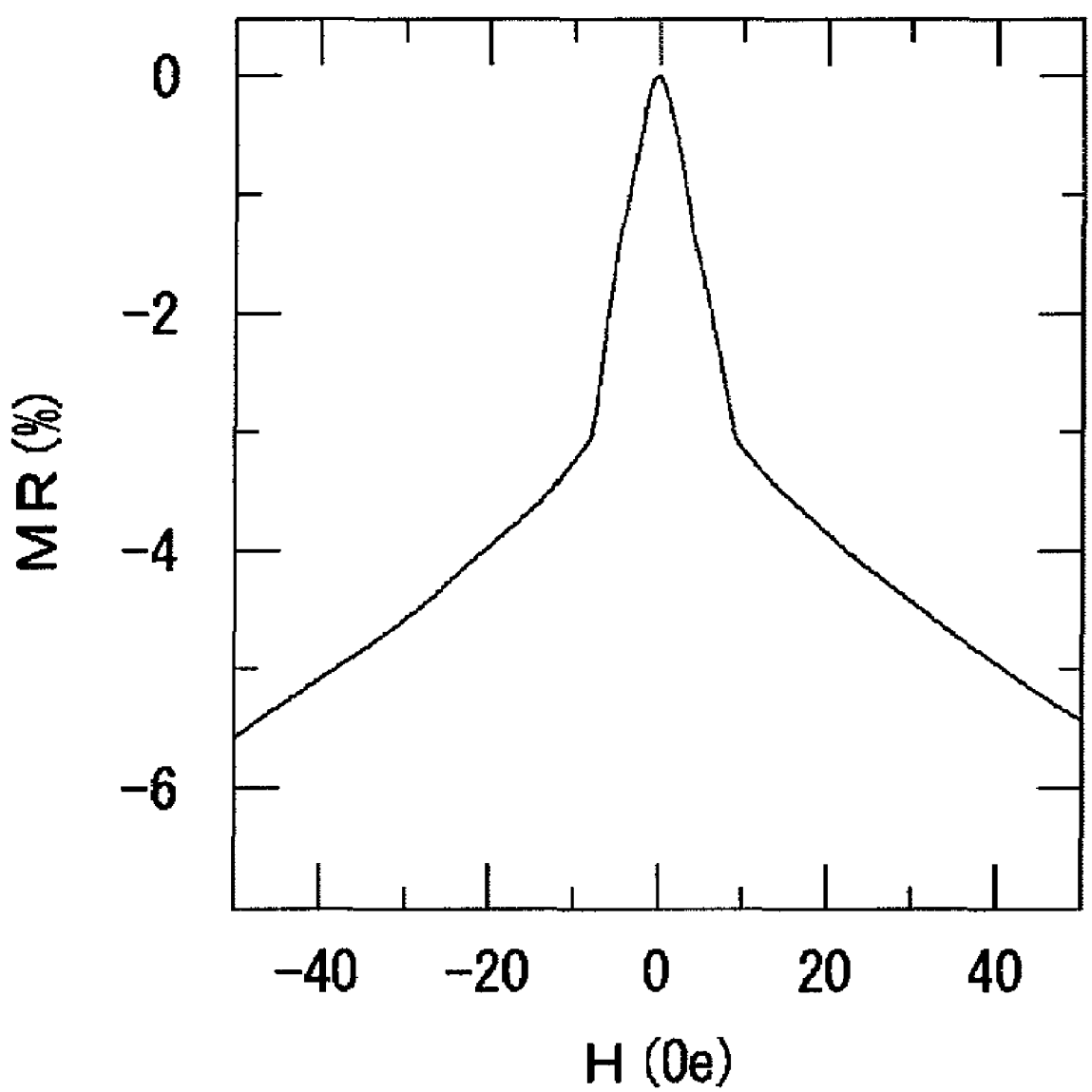
FIG. 4 is a graph showing MR characteristics of a thin film magnetic sensor shown in FIG. 1A.

Entire length $L_1$ of the thin film yokes 14,14×width $W_1$ of the longitudinal bar portion: 150 μm×20 μm Length $L_2$ of the lateral bar portion×width $W_2$ of the lateral bar portion: 20 μm×150 μm FIG. 4 shows MR characteristics of the obtained thin film magnetic sensor. It can be seen from FIG. 4 that the gradient for the region of a low magnetic field of $|H|≦10(Oe)$ is large and the gradient for the region of a high magnetic field of $|H|>10(Oe)$ is small. This shows that magnetic field can be measured at a high accuracy for the region of a low magnetic field and roughly but over a wide range for the region of a high magnetic field.

EXAMPLE 2

A thin film magnetic sensor 20 shown in FIG. 2 was manufactured and MR characteristics were evaluated. An FeCo—MgF$_2$ nano-granular alloy was used for the GMR film 22 and a $(Co_{94}Fe_6)_{70}Si_{15}B_{15}$ amorphous alloy was used for the thin film yokes 24,24.

Further, the size for each of the portions of the thin film yokes 24,24 is as described below.

Entire length $L_1$ of the thin film yokes 24,24×width $W_1$ of the longitudinally elongate portion: 150 μm×10 μm Length $L_2$ for the laterally elongate portion×width $W_2$ for the laterally elongate portion: 15 μm×20 μm.

Notch length $L_3$×Notch width $W_3$: 5 μm×1 μm

Figure 5:
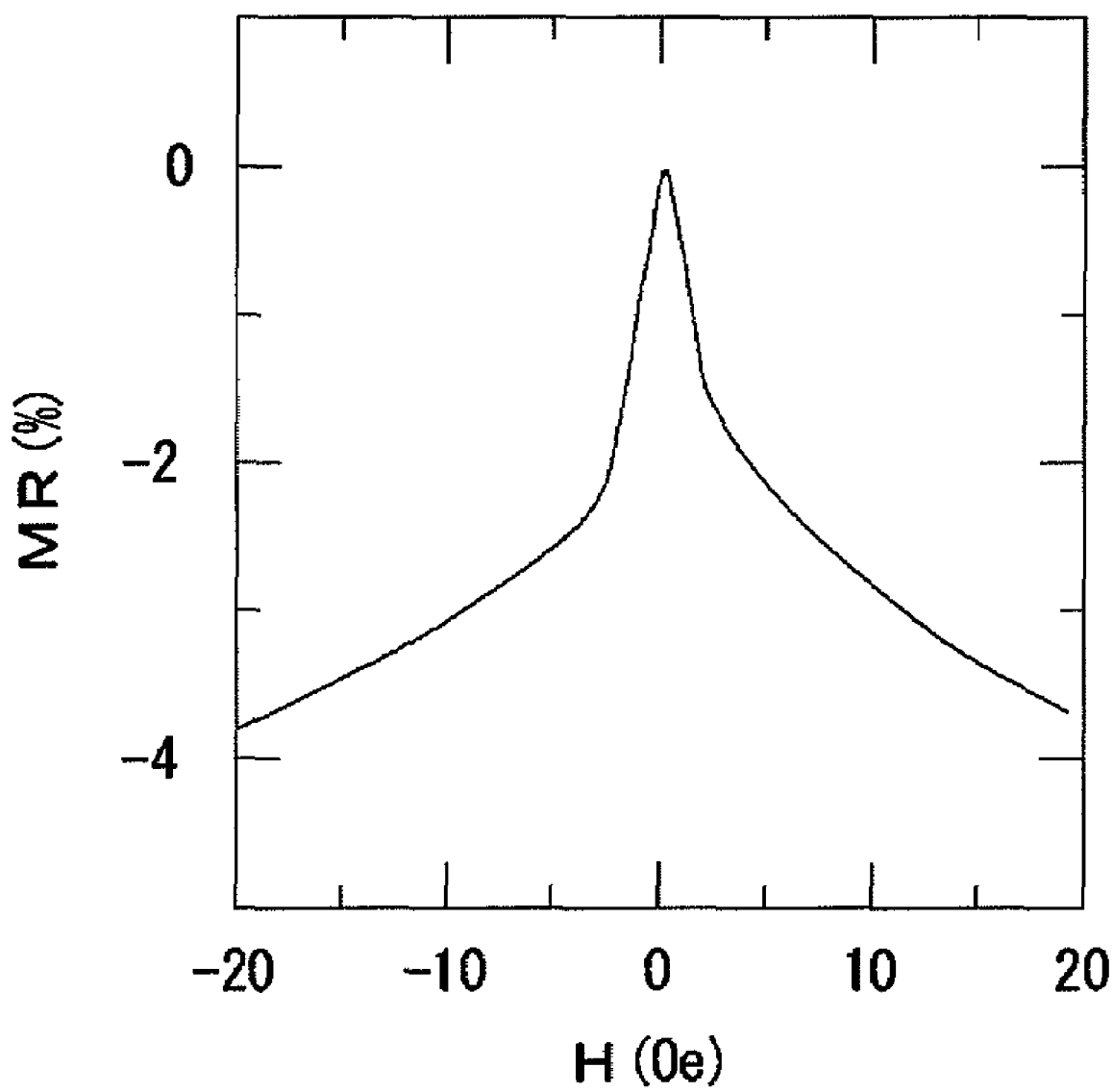
FIG. 5 is a graph showing MR characteristics of a thin film magnetic sensor shown in FIG. 2.

FIG. 5 shows MR characteristics of the obtained thin film magnetic sensor. It can be seen from FIG. 5 that the gradient for the region of a low magnetic field of $|H|≦5(Oe)$ is large and the gradient for the region of a high magnetic field of $|H|>5(Oe)$ is small. This shows that magnetic field can be measured at a high accuracy for the region of a low magnetic field and roughly but over a wide range for the region of a high magnetic field.

EXAMPLE 3

A thin film magnetic sensor 30 shown in FIG. 3 was manufactured and MR characteristics were evaluated. An FeCo—MgF$_2$ nano-granular alloy was used for the GMR film 32 and a $(Co_{94}Fe_6)_{70}Si_{15}B_{15}$ amorphous alloy was used for the thin film yokes 34,34.

Further, the size for each of the portions of the thin film yokes 34,34 is as described below.

Figure 6:
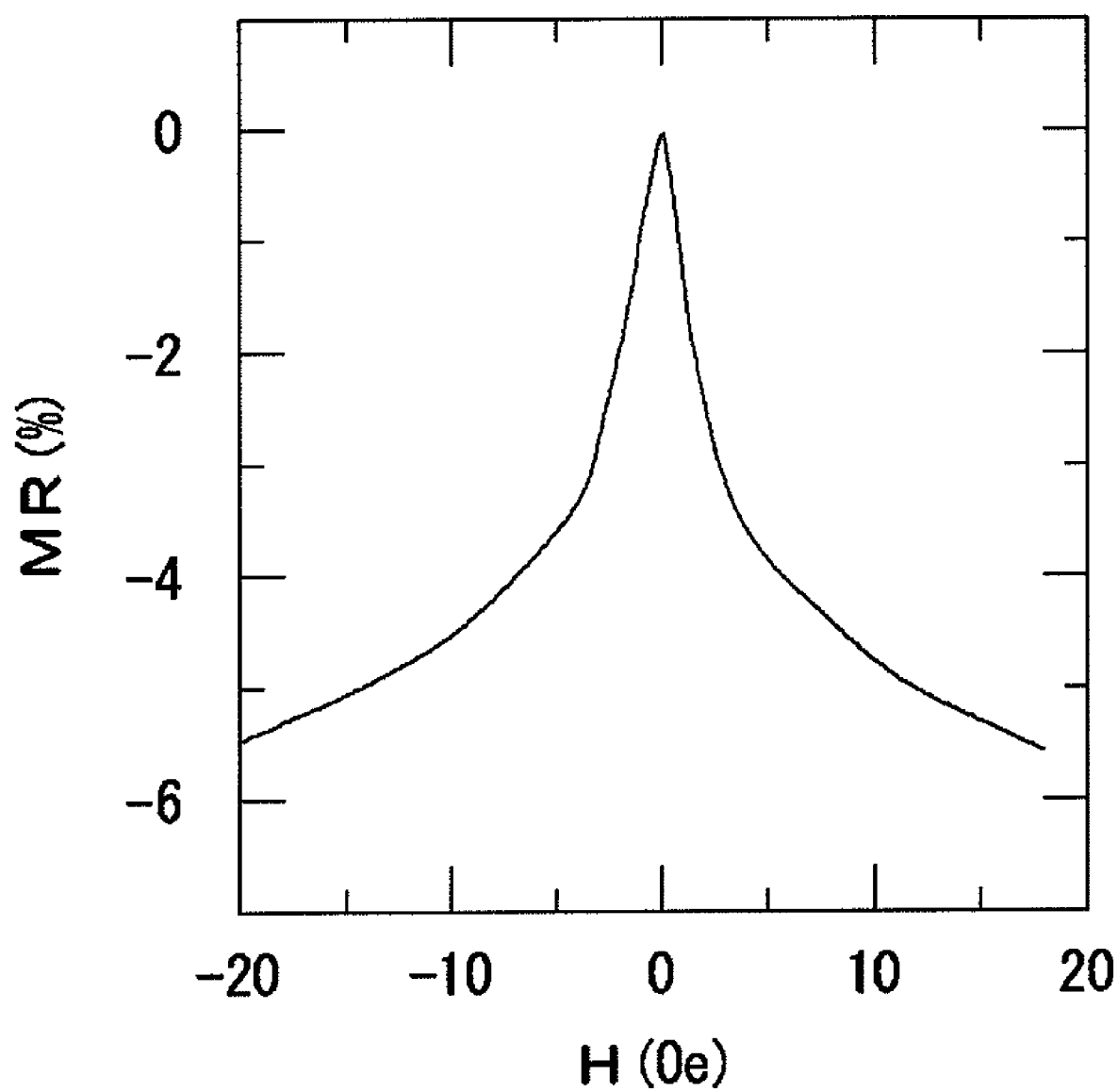
FIG. 6 is a graph showing MR characteristics of a thin film magnetic sensor shown in FIG. 3.

Entire length $L_1$ of the thin film yokes 24,24×width $W_1$ of the longitudinally elongate portion: 150 μm×20 μm Length $L_2$ of the laterally elongate portion×width $W_2$ of the laterally elongate portion: 40 μm×100 μm FIG. 6 shows MR characteristics of the obtained thin film magnetic sensor. It can be seen from FIG. 6 that the gradient for the region of a low magnetic field of $|H|≦5(Oe)$ is large and the gradient for the region of a high magnetic field of $|H|>5(Oe)$ is small. This shows that magnetic field can be measured at a high accuracy for the region of a low magnetic field and roughly but over a wide range for the region of a high magnetic field.

While the present invention has been described specifically by way of preferred embodiments, the invention is not restricted to the embodiments descried above, and it can be modified variously within a range not departing from the gist of the invention.

INDUSTRIAL APPLICABILITY

The thin film magnetic sensor according to the present invention can be used for detection of rotational information, for example, of car axles, rotary encoders, and industrial gears; detection of positional and speed information, for example, of stroke positions of hydraulic cylinders/pneumatic cylinders, and slides of machine tools; detection of current information, for example, of arc current of industrial welding robots; geometric magnetic direction compass, etc.

Further, while the magnetoresistive device having the GMR film and the thin film yokes disposed on both ends thereof are particularly suitable as a magnetic sensor, the application uses of the magnetoresistive device are not restricted to it and the device can be used also as a magnetic memory, a magnetic head, etc.

What is claimed is:

1. A thin film magnetic sensor comprising:
 a GMR film having a Giant Magneto-Resistance effect; and
 thin film yokes formed of a soft magnetic material connected electrically to both ends of the GMR film;
 wherein the thin film yokes have a high sensitivity portion with a demagnetizing factor of $N_L$ in a magnetic sensitive direction, and a low sensitivity portion with a demagnetizing factor of $N_H(>N_L)$ in the magnetic sensitive direction, the low sensitivity portion being connected electrically in series with the high sensitivity portion.

2. The thin film magnetic sensor according to claim 1,
 wherein the high sensitivity portion has one or more longitudinally elongate portions extended in the magnetic sensitive direction; and
 the low sensitivity portion has one or more laterally elongate portions extended from the longitudinally elongate portion in a direction intersecting the magnetic sensitive direction.

3. The thin film magnetic sensor according to claim 2, wherein the thin film yoke has a T-shape and is electrically connected with the GMR film by way of a lateral bar portion of the T-shape.

4. The thin film magnetic sensor according to claim 2, wherein the thin film yoke has a rectangular shape and is formed with one or more notches in a direction intersecting the magnetic sensitive direction.

5. The thin film magnetic sensor according to claim 4, wherein the width of the thin film yoke is identical with that of the GMR film.

6. The thin film magnetic sensor according to claim 4, wherein the width of the thin film yoke is larger than that of the GMR film.

7. The thin film magnetic sensor according to claim 1, wherein the thin film yoke has a T-shape and is electrically connected with the GMR film by way of a lateral bar portion of the T-shape.

8. The thin film magnetic sensor according to claim 1, wherein the thin film yoke has a rectangular shape and is formed with one or more notches in a direction intersecting the magnetic sensitive direction.

9. The thin film magnetic sensor according to claim 8, wherein the width of the thin film yoke is identical with that of the GMR film.

10. The thin film magnetic sensor according to claim 8, wherein the width of the thin film yoke is larger than that of the GMR film.

11. The thin film magnetic sensor according to claim 1, wherein the GMR film is formed of a metal-insulator based nano-granular material.

12. The thin film magnetic sensor according to claim 2, wherein the GMR film is formed of a metal-insulator based nano-granular material.

13. The thin film magnetic sensor according to claim 3, wherein the GMR film is formed of a metal-insulator based nano-granular material.

14. The thin film magnetic sensor according to claim 4, wherein the GMR film is formed of a metal-insulator based nano-granular material.

15. The thin film magnetic sensor according to claim 5, wherein the GMR film is formed of a metal-insulator based nano-granular material.

16. The thin film magnetic sensor according to claim 6, wherein the GMR film is formed of a metal-insulator based nano-granular material.

17. The thin film magnetic sensor according to claim 7, wherein the GMR film is formed of a metal-insulator based nano-granular material.

18. The thin film magnetic sensor according to claim 8, wherein the GMR film is formed of a metal-insulator based nano-granular material.

19. The thin film magnetic sensor according to claim 9, wherein the GMR film is formed of a metal-insulator based nano-granular material.

20. The thin film magnetic sensor according to claim 10, wherein the GMR film is formed of a metal-insulator based nano-granular material.

* * * * *